(12) United States Patent
Zhou et al.

(10) Patent No.: US 9,806,493 B2
(45) Date of Patent: Oct. 31, 2017

(54) METHOD FOR DETECTING INFLUENCE ON LASER FROM BACK-REFLECTION LIGHT OF LASER AND DETECTION DEVICE

(71) Applicant: Maxphotonics Co., Ltd., Shenzhen (CN)

(72) Inventors: Shaofeng Zhou, Shenzhen (CN); Liangjie Huang, Shenzhen (CN); Kai Li, Shenzhen (CN); Feng Jiang, Shenzhen (CN)

(73) Assignee: Maxphotonics Co., Ltd., Shenzhen (CN)

( * ) Notice: Subject to any disclaimer, the term of this patent is extended or adjusted under 35 U.S.C. 154(b) by 0 days.

(21) Appl. No.: 15/263,941

(22) Filed: Sep. 13, 2016

(65) Prior Publication Data

US 2017/0077671 A1   Mar. 16, 2017

(30) Foreign Application Priority Data

Sep. 15, 2015   (CN) .......................... 2015 1 0585296

(51) Int. Cl.
  *G02B 26/08* (2006.01)
  *H01S 5/00* (2006.01)
(52) U.S. Cl.
  CPC .......... *H01S 5/0064* (2013.01); *H01S 5/0014* (2013.01); *H01S 5/0071* (2013.01)
(58) Field of Classification Search
  CPC .... H01S 5/0064; H01S 5/0071; H01S 5/0014; H01S 5/00; H01S 5/0683; H01S 5/4025;
  (Continued)

(56) References Cited

U.S. PATENT DOCUMENTS

2013/0223844 A1*   8/2013   Hwang ................... H01S 5/146
                                                                  398/91

* cited by examiner

Primary Examiner — Euncha Cherry
(74) Attorney, Agent, or Firm — Ladas & Parry LLP

(57) ABSTRACT

The present invention discloses a method for detecting influence on a laser from back-reflected light of the laser and a detection device. The method includes: receiving laser light input by a laser; splitting the input light into first detection light and second detection light via a beam coupler having a specific distribution proportion, and outputting the first detection light and the second detection light to a first optical power meter and an adjustable reflector, respectively; receiving a part of the second detection light reflected by the adjustable reflector, splitting the part of the second detection light reflected by the adjustable reflector into first back-reflection light and second back-reflection light, and returning the first back-reflection light and the second back-reflection light to the laser and the first optical power meter, respectively, detecting power of the first detection light by using the first optical power meter, and detecting power of the second back-reflection light by using a second optical power meter, and calculating power of the input light of the laser and power of the first back-reflection light, and establishing a power corresponding relationship between the power of the first back-reflection light and the power of the input light of the laser. By means of the foregoing manner, the present invention can detect a corresponding relationship between power of back-reflection light and power of input light of a laser.

10 Claims, 2 Drawing Sheets

(58) Field of Classification Search
CPC ..... H01S 5/141; H01S 5/146; G02B 26/0816; G02B 26/08; G01N 21/55
USPC .................................................. 359/226.1
See application file for complete search history.

METHOD FOR DETECTING INFLUENCE ON LASER FROM BACK-REFLECTION LIGHT OF LASER AND DETECTION DEVICE

TECHNICAL FIELD

The present invention relates to the field of optical technologies, and more particularly to a method for detecting influence on a laser from back-reflection light of the laser and a detection device.

BACKGROUND

A semiconductor laser is a laser in which a semiconductor material is used as a working substance, has advantages such as a small volume, high efficiency, a simple structure, a relatively long service life, simple modulation, and a relatively low price, and is widely applied in the industry, communication, military, life science, medical treatment.

However, during working of the semiconductor laser, when a part of laser light emitted by the semiconductor laser returns back into the laser chip along the original path, laser power of the semiconductor laser decreases, which affects quality of a laser beam of the semiconductor laser, and burns the diode chip in severe cases, causing the laser to fail. With different chips and different packaging modes, back-reflection light of the semiconductor laser affects a laser beam differently. How to detect influence on a laser beam from back-reflection light is a problem that requires an urgent solution.

SUMMARY

A technical problem that the present invention is mainly to resolve is to provide a method for detecting influence on a laser from back-reflection light of the laser and a detection device, which detects a corresponding relationship between power of back-reflection light and power of input light of a laser.

To resolve the foregoing technical problem, a technical solution used by the present invention is to provide a method for detecting influence on a laser from back-reflection light of the laser, including: receiving input light input by a laser; splitting the input light into first detection light and second detection light, and outputting the first detection light and the second detection light to a first optical power meter and an adjustable reflector, respectively, where power of the first detection light and power of the input light satisfy a first predetermined relationship; receiving a part of the second detection light reflected by the adjustable reflector, splitting the part of the second detection light reflected by the adjustable reflector into first back-reflection light and second back-reflection light, and returning the first back-reflection light and the second back-reflection light to the laser and the first optical power meter, respectively, where power of the second back-reflection light and power of the first back-reflection light satisfy a second predetermined relationship; detecting the power of the first detection light by using the first optical power meter, and detecting the power of the second back-reflection light by using a second optical power meter; calculating the power of the input light of the laser according to the power of the first detection light, calculating the power of the first back-reflection light according to the power of the second back-reflection light, and establishing and outputting a power corresponding relationship between the power of the first back-reflection light and the power of the input light of the laser; and rotating the adjustable reflector times, to enable the adjustable reflector to be located at different reflection angles to reflect a part of the first detection light, so as to output power corresponding relationships, where is natural number greater than or equal to 2.

The first predetermined relationship between the power of the first detection light and the power of the input light is:

$$P'\text{output} = \tfrac{1}{2} P\text{input}$$

where P'output is the power of the first detection light, and is the power of the input light; and the second predetermined relationship between the power of the second back-reflection light and the power of the part of the first detection light reflected by the adjustable reflector is:

$$P'_{\text{back-reflected}} = P''_{\text{back-reflected}} = \tfrac{1}{2} P_{\text{reflected}}$$

where P'back-reflected is the power of the first back-reflection light, P'''back-reflected is the power of the second back-reflection light, and Preflected is the power of the part of the first detection light reflected by the adjustable reflector.

The method further includes: determining that the power of the first back-reflection light is greater than or equal to a power threshold value, and if the power of the first back-reflection light is greater than or equal to the power threshold value, raising an alarm.

The step of outputting the second detection light to an adjustable reflector is specifically: collimating the second detection light by using a collimating lens, and outputting the second detection collimated light to the adjustable reflector; and the step of receiving a part of the second detection light reflected by the adjustable reflector is specifically: receiving, by using the collimating lens, the part of the second detection light reflected by the adjustable reflector.

The method includes: establishing a mathematical relationship between the power of the first back-reflection light and the power of the input light of the laser according to power relationships and with reference to a preset mathematical model.

To resolve the foregoing technical problem, a technical solution used by the present invention is to provide a detection device, including a dual-channel optical coupler, a first optical power meter, a second optical power meter, an adjustable reflector, and a processor, where a first left port, a second left port, a first right port, and a second right port are disposed on the dual-channel optical coupler, the first left port is connected to a laser, the first optical power meter is connected to the first right port, the adjustable reflector is located in front of the second right port, the second optical power meter is connected to the second left port, and the processor is connected to the first optical power meter, the second optical power meter, and the adjustable reflector, respectively; the dual-channel optical coupler is configured to: receive, by using the first left port, input light input by the laser, split the laser input light into first detection light and second detection light, output the first detection light to the first optical power meter by using the first right port, and output the second detection light to the adjustable reflector by using the second right port, where power of the first detection light and power of the laser input light satisfy a first predetermined relationship, the adjustable reflector reflects a part of the second detection light to the second right port; the dual-channel optical coupler is further configured to: receive, by using the second right port, a part of the second detection light reflected by the adjustable reflector, split the part of the second detection light reflected by the adjustable reflector into first back-reflection light and second back-reflection light, return the first back-reflection light to the laser by using the first left port, and send the second back-reflection light to the first optical power meter by using the second port, where power of the second back-reflection light and power of the part of the first detection light reflected by the adjustable reflector satisfy a second predetermined relationship; and detect the power of the first detection light by using the first optical power meter, and detect the power of the second back-reflection light by using the second optical power meter; the processor is configured to: calculate the power of the input light of the laser according to the power of the first detection light, calculate power of the first back-reflection light according to the power of the second back-reflection light, and establish and output a power corresponding relationship between the power of the first back-reflection light and the power of the output light of the laser; and the processor is further configured to control the adjustable reflector to rotate for N−1 times, to enable the adjustable reflector to be located at N different reflection angles to reflect a part of the first defection light, so as to output N power corresponding relationships, where N is natural number greater than or equal to 2.

The first predetermined relationship between the power of the first detection light and the power of the laser input light is:

$$P'output = \tfrac{1}{2} Pinput$$

where P'output is the power of the first detection light, and is the power of the laser input light; and where the second predetermined relationship between the power of the second back-reflection light and the power of the part of the first detection light reflected by the adjustable reflector is:

$$P'_{back\text{-}reflected} = \tfrac{1}{2} P_{reflected},$$

P'back-reflected is the power of the first back-reflection light, and Preflected is the power of the part of the first detection light reflected by the adjustable reflector.

The detection device further includes an alarm apparatus, and the alarm apparatus is connected to the processor; and the processor is further configured to: determine whether the power of the first back-reflection light is greater than or equal to a power threshold value, and if the power of the first back-reflection light is greater than or equal to the power threshold value, control the alarm apparatus to raise an alarm.

The detection device further includes a collimating lens; and the collimating lens is disposed between the second left port and the adjustable reflector, the collimating lens is configured to collimate the second detection light and output the collimated second detection light to the adjustable reflector, and the part of the second detection light reflected by the adjustable reflector passes through the collimating lens and then be focused into the second left port.

The processor is further configured to establish a mathematical relationship between the power of the first back-reflection light and the power of the input light of the laser according to the N power corresponding relationships and with reference to a preset mathematical model.

Beneficial effects of the present invention are: Different from a case in the prior art, in the present invention, input light of a laser is split into first detection light and second detection light, the first detection light enters a first optical power meter, the second detection light enters an adjustable reflector, the adjustable reflector reflects a part of the first detection light, a part of the second detection light reflected by the adjustable reflector is split into first back-reflection light and second back-reflection light, the first back-reflection light is used as back-reflection light of the laser and returns to the laser, and the second back-reflection light enters the second optical power meter, where power of the first detection light and power of the input light satisfy a first predetermined relationship, and power of the second back-reflection light and power of the first back-reflection light satisfy a second predetermined relationship. Therefore, the power of the input light may be calculated by using the power of the first detection light, and the power of the first back-reflection light is calculated by using the power of the second back-reflection light, so as to establish a corresponding relationship between power of back-reflection light of the laser and the power of the input light of the laser.

DETAILED DESCRIPTION

The present invention is described below in detail with reference to the accompanying drawings and implementation manners.

Figure 1:
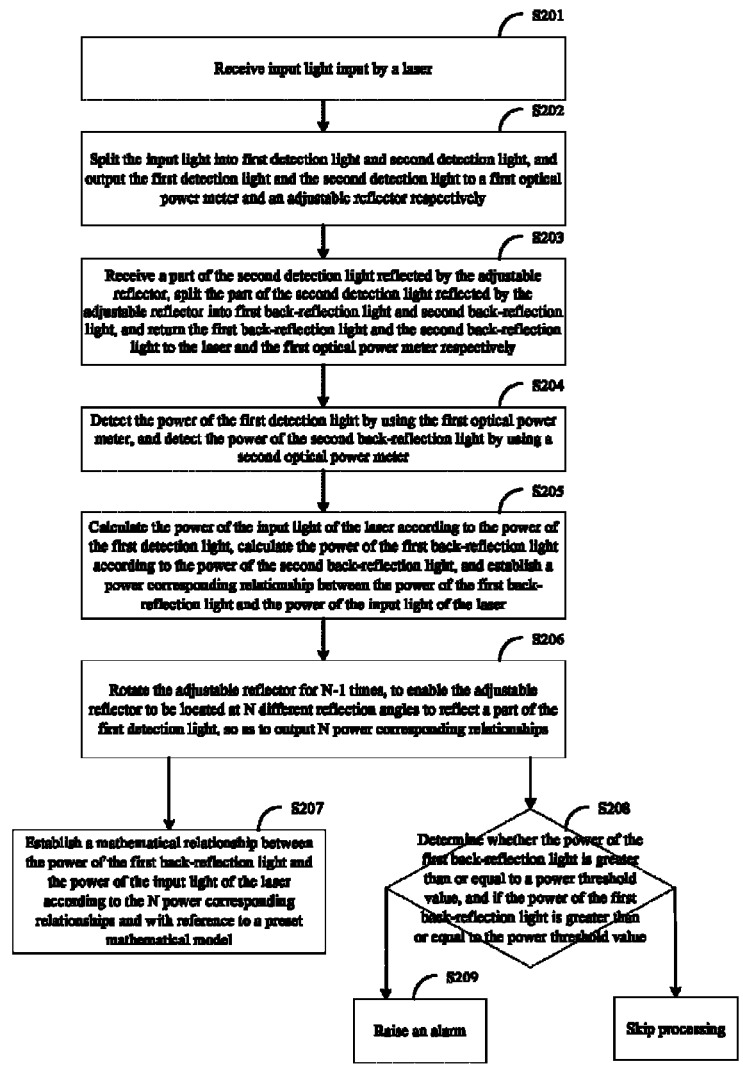
FIG. 1 is a flow chart of an implementation manner of a method for detecting influence on a laser from back-reflection light of the laser according to the present invention.

Referring to FIG. 1, a method for detecting influence on a laser from back-reflection light of the laser includes:

Step S201: Receive Input Light Input by a Laser.

In this embodiment, the laser refers to that a core pump source part in the laser does not include another optical device, for example, a laser chip.

Step S202: Split the input light into first detection light and second detection light, and output the first detection light and the second detection light to a first optical power meter and an adjustable reflector, respectively, where power of the first detection light and power of the output light satisfy a first predetermined relationship.

The laser input light is split into the first detection light and the second detection light according to a predetermined requirement. Therefore, in addition to that power of the first detection light and power of the input light satisfy a first predetermined relationship, power of the second detection light and the power of the input light also satisfy a particular relationship. In an implementation manner of the present invention, the input light of the laser is split into the first detection light and the second detection light by 5:5. That is, the input light of the laser is divided into two equal parts, and the power of the first detection light and the power of the second detection light are the same, and are both half of the input light of the laser, so that the first predetermined relationship is:

$$P'output = \tfrac{1}{2} Pinput$$

where P'output is the power of the first detection light, and is the power of the laser input light.

It should be noted that: a part of the second detection light reflected by the adjustable reflector is equivalent to back-reflection light of the laser, where the back-reflection light causes laser power of the laser to decrease, which affects quality of the input light of the laser.

Step S203: Receive a part of the second detection light reflected by the adjustable reflector, split the part of the second detection light reflected by the adjustable reflector into first back-reflection light and second back-reflection light, and return the first back-reflection light and the second back-reflection light to the laser and the first optical power meter respectively, where power of the second back-reflection light and power of the first back-reflection light satisfy a second predetermined relationship.

The part of the second detection light reflected by the adjustable reflector is also split into the first back-reflection light and the second back-reflection light according to a predetermined requirement. Therefore, in addition to that the power of the first back-reflection light and power of the part of the second detection light reflected by the adjustable reflector satisfy a particular relationship, the power of the second back-reflection light and the power of the part of the second detection light reflected by the adjustable reflector also satisfy a particular relationship, so as to derive the second predetermined relationship between the power of the first back-reflection light and the power of the second back-reflection light. In an implementation manner of the present invention, the part of the second detection light reflected by the adjustable reflector is divided into the first back-reflection light and the second back-reflection light by 5:5. That is, the part of the second detection light reflected by the adjustable reflector is divided into two equal parts, and the power of the first back-reflection light and the power of the second back-reflection light are the same, and are both half of the part of the second detection light reflected by the adjustable reflector, so that the second predetermined relationship is:

$$P'_{back-reflected} = P''_{back-reflected} = \tfrac{1}{2} P_{reflected}$$

where P'back-reflected is the power of the first back-reflection light, P''back-reflected is the power of the second back-reflection light, and Preflected is the power of the part of the first detection light reflected by the adjustable reflector.

Step S204: Detect the power of the first detection light by using the first optical power meter, and detect the power of the second back-reflection light by using a second optical power meter.

The first optical power meter and a second optical power meter are both configured to detect power of light.

Step S205: Calculate the power of the input light of the laser according to the power of the first detection light, calculate the power of the first back-reflection light according to the power of the second back-reflection light, and establish a power corresponding relationship between the power of the first back-reflection light and the power of the input light of the laser.

To prevent working power of the laser from changing and prevent the power of the input light from being affected, during detection of influence on the laser from back-reflected light, the laser may keep working at fixed power to perform detection. Certainly, when the laser works at different power, influence on the input light of the laser from the back-reflection light of the laser may also be detected.

Step S206: Rotate the adjustable reflector for N−1 times, to enable the adjustable reflector to be located at N different reflection angles to reflect a part of the first detection light, so as to output N power corresponding relationships, where N is natural number greater than or equal to 2.

When the adjustable reflector is located at a different reflection angle, a different amount of the second detection light is reflected by the adjustable reflector, and it is simulated that the laser generates back-reflection light having different power. By using the N power corresponding relationships, influence on the power of the input light of the laser from power of back-reflection light may be observed intuitively.

Further, the method further includes:

Step S207: Establish a mathematical relationship between the power of the first back-reflection light and the power of the input light of the laser according to the N power corresponding relationships and with reference to a preset mathematical model.

It should be noted that: the mathematical relationship mentioned in the present invention is not only limited to a linear relationship, and there may also be more than only one mathematical relationship, and may be multiple mathematical relationships. For example, when power of back-reflection light is within a different range, a different mathematical relationship is presented.

When the power of the back-reflection light is excessively high, the back-reflection light may damage the chip of the laser. To reduce a risk of damaging the chip of the laser during detection of influence on the laser from the back-reflection light of the laser, the method further includes:

Step S208: Determine whether the power of the first back-reflection light is greater than or equal to a power threshold value, and if the power of the first back-reflection light is greater than or equal to the power threshold value, the process enters Step S209, or otherwise, skip processing.

The power threshold value is a preset maximum power value of back-reflected light that the laser can withstand Step S209: Raise an alarm.

A manner of the alarm includes, but is not limited to, a sound alarm, and an image alarm.

Because the second detection light presents a radiated form, to make it convenient for the adjustable reflector to reflect a part of the second detection light, before the second detection light is further output to the adjustable reflector, collimation may be performed by using a collimating lens. The step of outputting the second detection light to an adjustable reflector in Step S202 is specifically: collimating the second detection light by using a collimating lens, and outputting the second detection collimated light to the adjustable reflector. The step of receiving a part of the second detection light reflected by the adjustable reflector in Step S203 is specifically: receiving, by using the collimating lens, the part of the second detection light reflected by the adjustable reflector.

In an implementation manner of the present invention, input light of a laser is split into first detection light and second detection light, the first detection light enters a first optical power meter, the second detection light enters an adjustable reflector, the adjustable reflector reflects a part of the first detection light, a part of the second detection light reflected by the adjustable reflector is split into first back-reflection light and second back-reflection light, the first back-reflection light is used as back-reflection light of the laser and returns to the laser, and the second back-reflection light enters the second optical power meter, where power of the first detection light and power of the input light satisfy a first predetermined relationship, and power of the second back-reflection light and power of the first back-reflection light satisfy a second predetermined relationship. Therefore, the power of the input light may be calculated by using the power of the first detection light, and the power of the first back-reflection light is calculated by using the power of the second back-reflection light, so as to establish a corresponding relationship between power of back-reflection light of the laser and the power of the input light of the laser.

Figure 2:
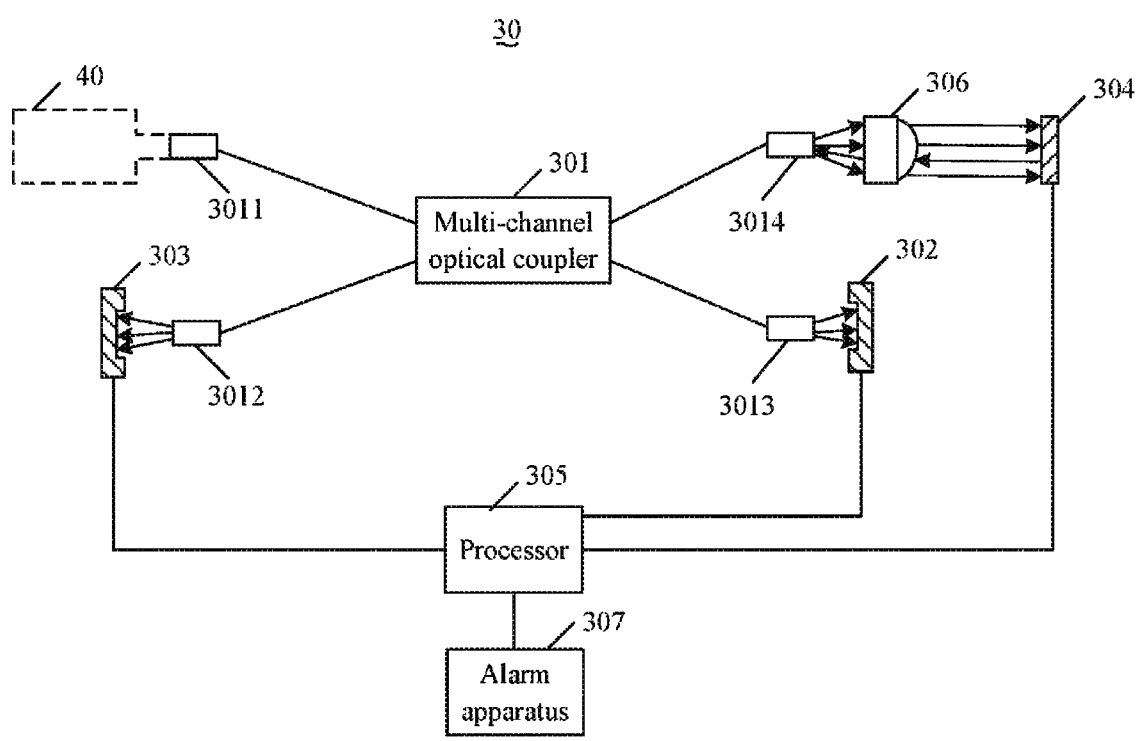
FIG. 2 is a schematic diagram of an implementation manner of a detection device according to the present invention.

The present invention further provides an implementation manner of a detection device. Referring to FIG. 2, a detection device 30 includes a dual-channel optical coupler 301, a first optical power meter 302, a second optical power meter 303, an adjustable reflector 304, and a processor 305. A first left port 3011, a second left port 3012, a first right port 3013, and a second right port 3014 are disposed on the dual-channel optical coupler 301. The first left port 3011 is connected to a laser 40. The first right port 3013 is connected to the first optical power meter 302. The adjustable reflector 304 is located in front of the second right port 3014. The second left port 3012 is connected to the second optical power meter 303. The processor 305 is connected to the first optical power meter 302, the second optical power meter 303, and the adjustable reflector 304, respectively.

The dual-channel optical coupler 301 is configured to receive, by using the first left port 3011, laser light input by the laser 40, split the input light into first detection light and second detection light, output the first detection light to the first optical power meter 302 by using the first right port 3013, and output the second detection light to the adjustable reflector 304 by using the second right port 3014, where the power of the first detection light and power of the output light satisfy a first predetermined relationship.

The dual-channel optical coupler 301 splits the input light of the laser 40 into the first detection light and the second detection light according to a predetermined relationship. In an implementation manner of the present invention, the input light of the laser 40 is split into the first detection light and the second detection light by 5:5. That is, the input light of the laser 40 is divided into two equal parts, the power of the first detection light and power of the second detection light are the same, and are both half of the input light of the laser 40, so that the first predetermined relationship is:

$$P'_{output} = \tfrac{1}{2} P_{input}$$

where P'output is the power of the first detection light, and is the power of the input light.

The adjustable reflector 304 reflects a part of the second detection light to the second right port 3014. The part of the second detection light reflected by the adjustable reflector 304 enters the dual-channel optical coupler 301 by using the second right port 3014. The dual-channel optical coupler 301 is further configured to receive, by using the second right port 3014, the part of the second detection light reflected by the adjustable reflector 304, split the part of the second detection light reflected by the adjustable reflector 304 into first back-reflection light and second back-reflection light, return the first back-reflection light to the laser 40 by using the first left port 3011, and send the second back-reflection light to the first optical power meter 302 by using the second port, where power of the second back-reflection light and power of the first back-reflection light satisfy a second predetermined relationship.

The dual-channel optical coupler 301 also splits the part of the second detection light reflected by the adjustable reflector 304 into the first back-reflection light and the second back-reflection light according to a predetermined requirement. Therefore, in addition to that the power of the first back-reflection light and the power of the part of the second detection light reflected by the adjustable reflector 304 satisfy a particular relationship, and the power of the second back-reflection light and the power of the part of the second detection light reflected by the adjustable reflector 304 also satisfy a particular relationship, so as to derive the second predetermined relationship between the power of the first back-reflection light and the power of the second back-reflection light. In an implementation manner of the present invention, the part of the second detection light reflected by the adjustable reflector 304 is divided into the first back-reflection light and the second back-reflection light by 5:5, and the second predetermined relationship is:

$$P'_{back\text{-}reflected} = P''_{back\text{-}reflected} = \tfrac{1}{2} P_{reflected}$$

where P'back-reflected is the power of the first back-reflection light, P''back-reflected is the power of the second back-reflection light, and Preflected is the power of the part of the first detection light reflected by the adjustable reflector.

The first optical power meter 302 detects the power of the first detection light, and detects the power of the second back-reflection light by using the second optical power meter. The processor 305 is configured to calculate the power of the input light of the laser 40 according to the power of the first detection light, calculate the power of the first back-reflection light according to the power of the second back-reflection light, and establish and output the power corresponding relationship between the power of the first back-reflection light and the power of the input light of the laser 40. The processor 305 is further configured to control the adjustable reflector 304 to rotate for N−1 times, to enable the adjustable reflector 304 to be located at N different reflection angles to reflect a part of the first detection light, so as to output N power corresponding relationships, where N is natural number greater than or equal to 2.

When the adjustable reflector 304 is located at a different reflection angle, a different amount of the second detection light is reflected by the adjustable reflector 304. Therefore, the power of the second back-reflection light is different, and changes of the input light of the laser 40 may be detected under different back-reflection light. back-reflection light. Further, the processor 305 is further configured to establish a mathematical relationship between the power of the first back-reflection light and the power of the input light of the laser 40 according to the N power corresponding relationships and with reference to a preset mathematical model.

The detection device 30 further includes a collimating lens 306 and an alarm apparatus 307. The alarm apparatus 307 is connected to the processor 305. The processor 305 is further configured to: determine whether the power of the first back-reflection light is greater than or equal to a power threshold value, and if the power of the first back-reflection light is greater than or equal to the power threshold value, control the alarm apparatus 307 to raise an alarm. Certainly, the processor 305 may also control, by using the alarm, the amount of the part of the second detection light reflected by the adjustable reflector 304, so as to reduce the power of the second back-reflection light, thereby preventing the power of the second back-reflection light from becoming excessively high and preventing a chip of the laser 40 from being damaged.

The collimating lens 306 is disposed between the second right port 3014 and the adjustable reflector 304, the collimating lens 306 is configured to collimate the second detection light and output the collimated second detection light to the adjustable reflector 304, and the part of the second detection light reflected by the adjustable reflector 304 passes through the collimating lens 306 and then be focused into the second left port again.

In an implementation manner of the present invention, input light of a laser is split into first detection light and second defection light, the first detection light enters a first optical power meter, the second detection light enters an adjustable reflector, the adjustable reflector reflects a part of the first detection light, a part of the second detection light reflected by the adjustable reflector is split into first back-reflection light and second back-reflection light, the first back-reflection light is used as back-reflection light of the laser and returns to the laser, and the second back-reflection light enters the second optical power meter, where power of the first detection light and power of the input light satisfy a first predetermined relationship, and power of the second back-reflection light and power of the first back-reflection light satisfy a second predetermined relationship. Therefore, the power of the input light may be calculated by using the power of the first detection light, and the power of the first back-reflection light is calculated by using the power of the second back-reflection light, so as to establish a corresponding relationship between power of back-reflection light of the laser and the power of the input light of the laser.

Only implementation manners of the present invention are described above, and are not intended to limit the patent scope of the present invention. Any equivalent variations in structure or equivalent variations in procedure made by using the content of the specification and the accompanying drawings of the present invention or any direct or indirect use in another related technical field similarly fall within the patent protection scope of the present invention.

What is claimed is:

1. A method for detecting influence on a laser from back-reflected light of the laser, comprising:
   receiving laser light input by a laser;
   splitting the input light into first detection light and second detection light, and outputting the first detection light and the second detection light to a first optical power meter and an adjustable reflector, respectively, where the power of the first detection light and power of the input light satisfy a first predetermined relationship;
   receiving a part of the second detection light reflected by the adjustable reflector, splitting the part of the second detection light reflected by the adjustable reflector into first back-reflection light and second back-reflection light, and returning the first back-reflection light and the second back-reflection light to the laser and the first optical power meter, respectively, where the power of the second back-reflection light and power of the first back-reflection light satisfy a second predetermined relationship;
   detecting the power of the first detection light by using the first optical power meter, and detecting the power of the second back-reflection light by using a second optical power meter;
   calculating the power of the input light of the laser according to the power of the first detection light, calculating the power of the first back-reflection light according to the power of the second back-reflection light, and establishing and outputting a power corresponding relationship between the power of the first back-reflection light and the power of the input light of the laser; and
   rotating the adjustable reflector for N−1 times, to enable the adjustable reflector to be located at N different reflection angles to reflect a part of the first detection light, so as to output N power corresponding relationships, wherein N is natural number greater than or equal to 2.

2. The method according to claim 1, wherein
the first predetermined relationship between the power of the first detection light and the power of the input light is:

P'output=½Pinput, ½P being optionally 1/N, N being an integer greater than 1,
   wherein P'output is the power of the first detection light, and P'input is the power of the input light; and
the second predetermined relationship between the power of the second back-reflection light and the power of the part of the first detection light reflected by the adjustable reflector is:

$P'_{back-reflected}=P''_{back-reflected}=½P_{reflected}$, ½P being optionally 1/N, N being an integer greater than 1, $P'_{back-reflected}$ being not necessarily equal to $P''_{back-reflected}$ as long as the proportional relationship is satisfied,
   wherein P'back-reflected is the power of the first back-reflection light, P''back-reflected is the power of the second back-reflection light, and Preflected is the power of the part of the first detection light reflected by the adjustable reflector.

3. The method according to claim 1, wherein the method further comprises:
   determining that the power of the first back-reflection light is greater than or equal to a power threshold value; and
   if the power of the first back-reflection light is greater than or equal to the power threshold value, raising an alarm.

4. The method according to claim 1, wherein
the step of outputting the second detection light to an adjustable reflector is specifically: collimating the second detection light by using a collimating lens, and outputting the second detection collimated light to the adjustable reflector; and
the step of receiving a part of the second detection light reflected by the adjustable reflector is specifically: receiving, by using the collimating lens, the part of the second detection light reflected by the adjustable reflector.

5. The method according to claim 1 wherein the method comprises:
   establishing a mathematical relationship between the power of the first back-reflection light and the power of the input light of the laser according to the N power corresponding relationships and with reference to a preset mathematical model.

6. A detection device, comprising a dual-channel optical coupler, a first optical power meter, a second optical power meter, an adjustable reflector, and a processor, wherein a first left port, a second left port, a first right port, and a second right port are disposed on the dual-channel optical coupler, the first left port is connected to a laser, the first optical power meter is connected to the first right port, the adjustable reflector is located in front of the second right port, the second optical power meter is connected to the second left port, and the processor is connected to the first optical power meter, the second optical power meter, and the adjustable reflector, respectively;
   the dual-channel optical coupler is configured to: receive, by using the first left port, light input by the laser, split the input light into first detection light and second detection light, output the first detection light to the first optical power meter by using the first right port, and output the second detection light to the adjustable reflector by using the second right port, wherein power of the first detection light and power of the input light satisfy a first predetermined relationship;
   the adjustable reflector reflects a part of the second detection light to the second right port;
   the dual-channel optical coupler is further configured to: receive, by using the second right port, a part of the second detection light reflected by the adjustable reflector, split the part of the second detection light reflected by the adjustable reflector into first back-reflection light and second back-reflection light, return the first back-reflection light to the laser by using the first left port, and send the second back-reflection light to the first optical power meter by using the second port, wherein power of the second back-reflection light and power of the part of the first detection light reflected by the adjustable reflector satisfy a second predetermined relationship; and detect the power of the first detection light by using the first optical power meter, and detect the power of the second back-reflection light by using the second optical power meter;

the processor is configured to: calculate the power of the input light of the laser according to the power of the first detection light, calculate power of the first back-reflection light according to the power of the second back-reflection light, and establish and output a power corresponding relationship between the power of the first back-reflection light and the power of the input light of the laser; and the processor is further configured to control the adjustable reflector to rotate for N−1 times, to enable the adjustable reflector to be located at N different reflection angles to reflect a part of the first detection light, so as to output N power corresponding relationships, wherein N is natural number greater than or equal to 2.

7. The detection device according to claim 6, wherein the first predetermined relationship between the power of the first detection light and the power of the input light is:

P'output=½Pinput, ½P being optionally 1/N, N being an integer greater than 1, wherein P'input is the power of the first detection light, and P'output is the power of the output light; and the second predetermined relationship between the power of the second back-reflection light and the power of the part of the first detection light reflected by the adjustable reflector is:

$P'_{back-reflected} = \frac{1}{2} P_{reflected}$, ½P being optionally 1/N, N being an integer greater than 1, wherein P'back-reflected is the power of the first back-reflection light, and Preflected is the power of the part of the first detection light reflected by the adjustable reflector.

8. The detection device according to claim 6, wherein the detection device further comprises an alarm apparatus, and the alarm apparatus is connected to the processor; and the processor is further configured to: determine whether the power of the first back-reflection light is greater than or equal to a power threshold value, and if the power of the first back-reflection light is greater than or equal to the power threshold value, control the alarm apparatus to raise an alarm.

9. The detection device according to claim 6, wherein the detection device further comprises a collimating lens; and the collimating lens is disposed between the second right port and the adjustable reflector, the collimating lens is configured to collimate the second detection light and output the collimated second detection light to the adjustable reflector, and the part of the second detection light reflected by the adjustable reflector passes through the collimating lens and then be focused into the second left port again.

10. The detection device according to claim 6, wherein the processor is further configured to establish a mathematical relationship between the power of the first back-reflection light and the power of the input light of the laser according to the N power corresponding relationships and with reference to a preset mathematical model.

\* \* \* \* \*